United States Patent
Yamamoto (10) Patent No.: US 9,804,032 B2
(45) Date of Patent: Oct. 31, 2017

(54) DETECTING DEVICE AND ELECTRONIC APPARATUS

(71) Applicant: Seiko Epson Corporation, Tokyo (JP)

(72) Inventor: Gakuji Yamamoto, Fujimi (JP)

(73) Assignee: Seiko Epson Corporation (JP)

( * ) Notice: Subject to any disclaimer, the term of this patent is extended or adjusted under 35 U.S.C. 154(b) by 71 days.

(21) Appl. No.: 14/843,171

(22) Filed: Sep. 2, 2015

(65) Prior Publication Data

US 2016/0072458 A1 Mar. 10, 2016

(30) Foreign Application Priority Data

Sep. 4, 2014 (JP) ................. 2014-179748

(51) Int. Cl.
*G01J 5/34* (2006.01)
*H03F 3/387* (2006.01)
*H03F 3/45* (2006.01)

(52) U.S. Cl.
CPC ........... *G01J 5/34* (2013.01); *H03F 3/387* (2013.01); *H03F 3/45475* (2013.01); *H03F 2200/261* (2013.01); *H03F 2200/271* (2013.01); *H03F 2203/45136* (2013.01); *H03F 2203/45514* (2013.01)

(58) Field of Classification Search
CPC ....................................................... G01J 5/34
See application file for complete search history.

(56) References Cited

U.S. PATENT DOCUMENTS 6,402,369 B1 * 6/2002 Ludington ........... G01N 25/482
136/204

FOREIGN PATENT DOCUMENTS

| CN | 201448275 | * | 5/2010 |
| JP | 2012-165079 A | | 8/2012 |
| JP | 2013-148488 A | | 8/2013 |
| WO | WO-2011-148605 A1 | | 12/2011 |

OTHER PUBLICATIONS

Machine Translation of Abstract of CN 201448275.*

* cited by examiner

*Primary Examiner* — Yara B Green
(74) *Attorney, Agent, or Firm* — Harness, Dickey & Pierce, P.L.C.

(57) ABSTRACT

A detecting device includes a pyroelectric element that generates charge by a pyroelectric effect in a first detection terminal and a second detection terminal, a chopper amplifier circuit that generates an amplified signal in response to the charge generated in the first detection terminal and the second detection terminal by chopping, and an initialization switch that controls electrical connection between the second detection terminal and a power source for generating an initialized voltage, and the initialization switch is turned on before a start of an amplification operation by the amplifier circuit and is off during the amplification operation.

6 Claims, 8 Drawing Sheets

FIG. 6A
AMPLIFICATION PERIOD QA

FIG. 6B
PERIOD PA

FIG. 6C
PERIOD PB

FIG. 6D
PERIOD PC

FIG. 6E
AMPLIFICATION PERIOD QB

FIG. 7A AMPLIFICATION PERIOD QB

FIG. 7B PERIOD PA

FIG. 7C PERIOD PB

FIG. 7D PERIOD PC

FIG. 7E AMPLIFICATION PERIOD QA

DETECTING DEVICE AND ELECTRONIC APPARATUS

BACKGROUND

1. Technical Field

The present invention relates to a detection technology using a capacitive detecting element including a pyroelectric element.

2. Related Art

Various technologies for generating output signals in response to detection results by capacitive detecting elements including pyroelectric elements have been proposed. For example, Patent Document 1 (JP-A-2013-148488) discloses a detecting device using a pyroelectric element, a source follower circuit, and a differential amplifier circuit.

However, in the technology of Patent Document 1, noise such as Johnson noise and flicker noise due to operations of the respective elements including a transistor forming the detection circuit is generated, and generation of output signals with higher S/N-ratios is not easy.

SUMMARY

An advantage of some aspects of the invention is to reduce noise of output signals generated using a capacitive element including a pyroelectric element.

A detecting device according to an aspect of the invention includes a pyroelectric element that generates a voltage between a first detection terminal and a second detection terminal by a pyroelectric effect, and a chopper amplifier circuit that generates an amplified signal in response to the voltage by chopping. According to the aspect of the invention, the chopper amplifier circuit is used for generation of the amplified signal in response to the voltage generated in the pyroelectric element. Therefore, noise of the signal generated using the pyroelectric element can be reduced.

In a preferred aspect of the invention, the detecting device further includes an initialization switch that controls electrical connection between at least one of the first detection terminal and the second detection terminal and a power source for generating an initialized voltage, wherein the initialization switch is turned on before a start of an amplification operation by the amplifier circuit and is off during the amplification operation. According to the configuration, the initialization switch is maintained in the OFF-state during the execution of the amplification operation, and thereby, the amplification operation by the amplifier circuit can be stabilized.

In a preferred aspect of the invention, the amplifier circuit is a circuit that outputs an amplified signal in response to the voltage generated between a first input terminal connected to the first detection terminal and a second input terminal connected to the second detection terminal to a first output terminal and a second output terminal, and includes a fully differential operational amplifier including a first amplification input terminal, a second amplification input terminal, a first amplification output terminal, and a second amplification output terminal, a first capacity between the first input terminal and the first output terminal, a second capacity between the second input terminal and the second output terminal, a modulation circuit that switches electrical connection between the first input terminal and the second input terminal and the first amplification input terminal and the second amplification input terminal, and a demodulation circuit that switches electrical connection between the first amplification output terminal and the second amplification output terminal and the first output terminal and the second output terminal. According to the configuration, by chopping using the modulation circuit of switching the electrical connection between the first input terminal and the second input terminal and the first amplification input terminal and the second amplification input terminal and the demodulation circuit of switching the electrical connection between the first amplification output terminal and the second amplification output terminal and the first output terminal and the second output terminal, the signal with sufficiently reduced noise (or the signal with effectively suppressed noise by processing after amplification) can be generated.

In a preferred aspect of the invention, the amplifier circuit includes a first switch provided between ends of the first capacity, and a second switch provided between ends of the second capacity, wherein the first switch and the second switch are turned on before a start of an amplification operation by the amplifier circuit and is off during the amplification operation. According to the configuration, the first switch and the second switch are controlled in the ON-state before the start of the amplification operation and the voltages of the first capacity and the second capacity are initialized, and thereby, there is an advantage that the influence of the remaining charge in the first capacity and the second capacity before the start of the amplification operation may be reduced and the appropriate amplification operation may be executed.

The detecting device according to the respective configurations are used for various electronic apparatuses. For example, a detecting device employing a pyroelectric element as a detecting element may be mounted on an electronic apparatus for sensing an object to be detected (e.g. human) using e.g. infrared light, however, application of the detecting device in the electronic apparatus is not limited to the detection of infrared light.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
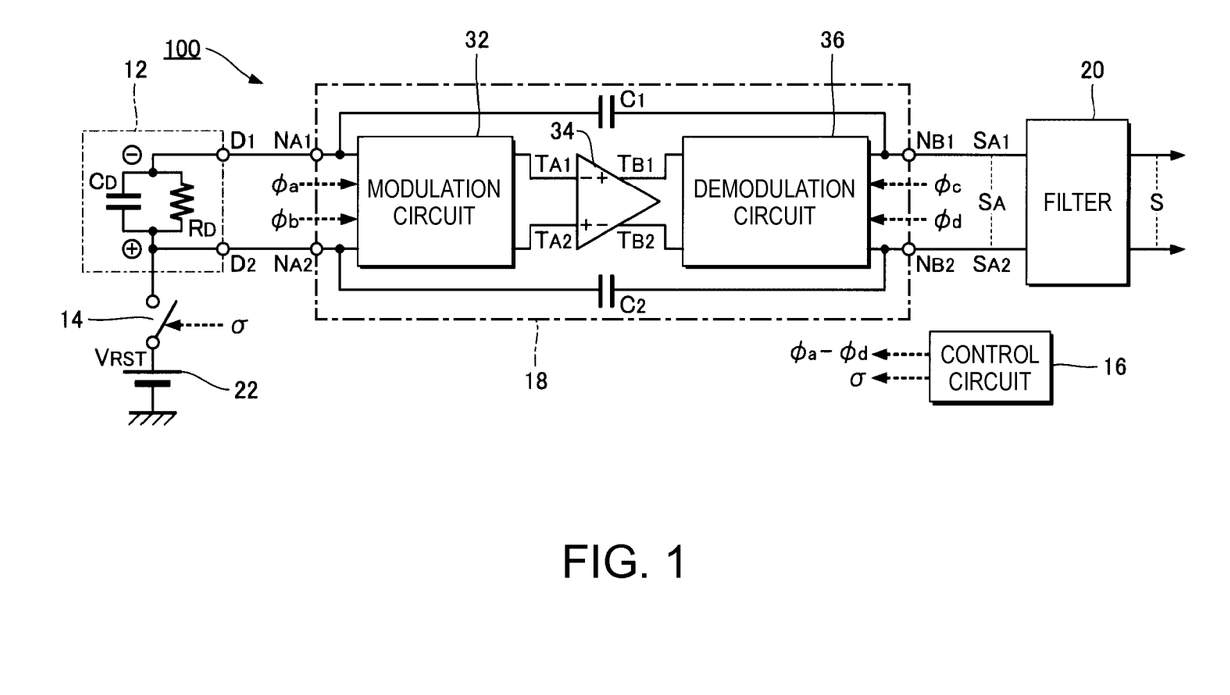
FIG. 1 is a configuration diagram of a detecting device according to a first embodiment of the invention.

FIG. 1 is a configuration diagram of a detecting device 100 according to the first embodiment of the invention. The detecting device 100 of the first embodiment is an electronic circuit that detects infrared light and generates an output signal S in response to a detection result, and, as exemplified in FIG. 1, includes a pyroelectric element 12, an initialization switch 14, a control circuit 16, an amplifier circuit 18, and a filter 20. The control circuit 16 controls the respective elements of the detecting device 100. Specifically, the control circuit 16 of the first embodiment controls the initialization switch 14 by supplying a control signal σ and controls the amplifier circuit 18 by supplying control signals φ (φa to φd).

The pyroelectric element 12 in FIG. 1 is a detecting element that generates charge by the pyroelectric effect of the pyroelectric material (not shown), and is equivalently formed by a capacity CD and a resistance RD connected in parallel to each other between a first detection terminal D1 and a second detection terminal D2. The pyroelectric element 12 of the first embodiment is used as a capacitive detecting element that detects infrared light. That is, spontaneous polarization is generated in the pyroelectric material (pyroelectric effect) in response to a temperature change due to irradiation of infrared light, and thereby, charge in response to the intensity of the infrared light (voltage in response to the charge) is generated in the first detection terminal D1 and the second detection terminal D2. Specifically, charge with opposite polarity in equal amounts of charge to each other is generated in the first detection terminal D1 and the second detection terminal D2. In the first embodiment, as exemplified in FIG. 1, the case where negative charge is generated in the first detection terminal D1 and positive charge is generated in the second detection terminal D2 is assumed. The initialization switch 14 in FIG. 1 controls electrical connection (conduction/insulation) with a power source 22 that generates a predetermined voltage (hereinafter, referred to as "initialized voltage") VRST with the second detection terminal D2 of the pyroelectric element 12.

The amplifier circuit 18 generates a voltage signal of a differential in response to the charge generated in the pyroelectric element 12 (hereinafter, referred to as "amplified signal") SA (voltage SA1 and voltage SA2). As exemplified in FIG. 1, the amplifier circuit 18 includes a first input terminal NA1, a second input terminal NA2, a first output terminal NB1, and a second output terminal NB2. The first input terminal NA1 is electrically connected to the first detection terminal D1 of the pyroelectric element 12 and the second input terminal NA2 is electrically connected to the second detection terminal D2 of the pyroelectric element 12. The amplifier circuit 18 of the first embodiment is a chopper amplifier (chopper stabilized amplifier) that generates the amplified signal SA in response to the charge supplied to the first input terminal NA1 and the second input terminal NA2 (i.e., the charge signal of the differential from the pyroelectric element 12), and, as exemplified in FIG. 1, includes a modulation circuit 32, an operational amplifier 34, a demodulation circuit 36, a capacity C1, and a capacity C2.

The operational amplifier 34 is a fully differential operational amplifier including a negative-side input terminal TA1, a positive-side input terminal TA2, a positive-side output terminal TB1, and a negative-side output terminal TB2. The capacity C1 is provided between the first input terminal NA1 and the first output terminal NB1 and the capacity C2 is provided between the second input terminal NA2 and the second output terminal NB2. Further, the modulation circuit 32 is provided on the input side of the operational amplifier 34 and the demodulation circuit 36 is provided on the output side of the operational amplifier 34.

The modulation circuit 32 cyclically switches the electrical connection between the first input terminal NA1 and the second input terminal NA2 and the negative-side input terminal TA1 and the positive-side input terminal TA2 of the operational amplifier 34. The demodulation circuit 36 cyclically switches the electrical connection between the positive-side output terminal TB1 and the negative-side output terminal TB2 of the operational amplifier 34 and the first output terminal NB1 and the second output terminal NB2 to generate the amplified signal SA. The frequency (chopping frequency) fc of the modulation by the modulation circuit 32 and the demodulation by the demodulation circuit 36 is specified by the control signals φ (φa to φd) supplied from the control circuit 16.

Figure 2A:
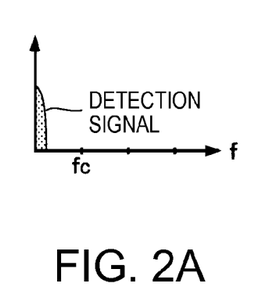
FIGS. 2A to 2C are explanatory diagrams of variations of frequency bands due to an amplification operation.
Figure 2B:
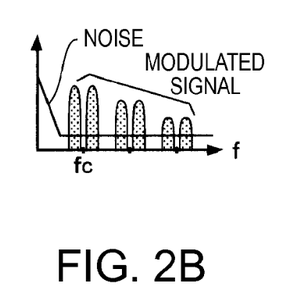
Figure 2C:
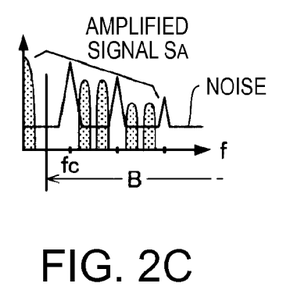

As exemplified in FIG. 2A, the detection signal (charge signal) represented by the charge supplied to the first input terminal NA1 and the second input terminal NA2 dominantly contains the signal component at the lower frequency side including the direct-current component, and, as exemplified in FIG. 2B, transitions to the higher frequency side after the modulation by the modulation circuit 32. Note that, in FIG. 2B, side band wave due to the modulation is also shown. On the other hand, in the amplification by the operational amplifier 34, as exemplified in FIG. 2B, noise at the lower frequency side (e.g. Johnson noise or flicker noise) due to operations of the respective elements including a transistor forming the operational amplifier 34 is superimposed on the modulated signal after processing by the modulation circuit 32. Then, in the amplified signal SA generated in the demodulation by the demodulation circuit 36, the frequency band of the modulated signal transitions to the lower frequency side and the frequency band of the noise transitions to the higher frequency side. In FIG. 2C, a frequency band B at the higher frequency side of the amplified signal SA in which noise and the side band wave exist is shown. The frequency band B is a band containing the frequency fc.

The filter 20 in FIG. 1 generates an output signal S by suppressing (ideally, removing) the signal component of the frequency band B at the higher frequency side containing the frequency fc of the amplified signal SA generated by the amplifier circuit 18. For example, a low-pass filter or a band-pass filter for a passband at the lower frequency side of the frequency band B is preferably used as the filter 20 of the first embodiment. According to the above described configuration, the output signal S with suppressed noise of the operational amplifier 34 and a higher S/N ratio can be generated.

Figure 3:
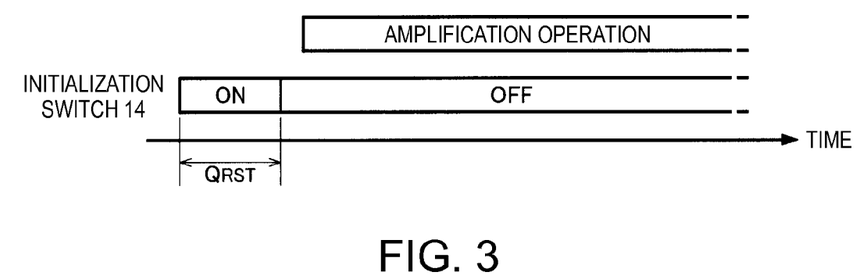
FIG. 3 is an explanatory diagram of an operation of an initialization switch.

FIG. 3 is an explanatory diagram of a schematic operation of the detecting device 100. As exemplified in FIG. 3, the initialization switch 14 is in an ON-state in an initialization period QRST having a predetermined length before the start of the amplification operation of generating the amplified signal SA in response to the charge of the pyroelectric element 12 by the amplifier circuit 18 and maintains an OFF-state during execution of the amplification operation in response to the control signal σ supplied from the control circuit 16. The initialization switch 14 is controlled in the ON-state in the initialization period QRST, and thereby, the voltage of the second detection terminal D2 is initialized to the initialized voltage VRST before the start of the amplification operation. On the other hand, during the execution of the amplification operation, the initialization switch 14 is maintained in the OFF-state, and thereby, the second detection terminal D2 and the first detection terminal D1 of the pyroelectric element 12 are maintained in an electrically floating state.

Figure 4:
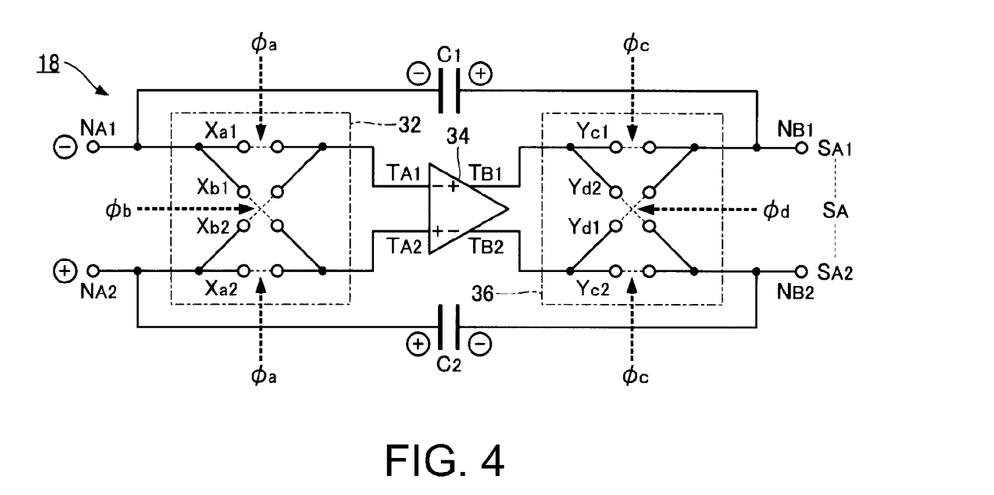
FIG. 4 is an explanatory diagram of an amplifier circuit.

FIG. 4 is a specific configuration diagram of the amplifier circuit 18 of the first embodiment. As exemplified in FIG. 4, the control signal $\phi a$ and the control signal $\phi b$ generated by the control circuit 16 are supplied to the modulation circuit 32, and the control signal $\phi c$ and the control signal $\phi d$ generated by the control circuit 16 are supplied to the demodulation circuit 36.

As exemplified in FIG. 4, the modulation circuit 32 includes a plurality of switches (Xa1, Xa2, Xb1, Xb2) for controlling the electrical connection (conduction/insulation) between the first input terminal NA1 and the second input terminal NA2 and the negative-side input terminal TA1 and the positive-side input terminal TA2 of the operational amplifier 34. The switch Xa1 controls the connection between the first input terminal NA1 and the negative-side input terminal TA1, and the switch Xb1 controls the connection between the first input terminal NA1 and the positive-side input terminal TA2. Further, the switch Xa2 controls the connection between the second input terminal NA2 and the positive-side input terminal TA2, and the switch Xb2 controls the connection between the second input terminal NA2 and the negative-side input terminal TA1. The switch Xa1 and the switch Xa2 operate in response to the control signal $\phi a$, and the switch Xb1 and the switch Xb2 operate in response to the control signal $\phi b$.

As exemplified in FIG. 4, the demodulation circuit 36 includes a plurality of switches (Yc1, Yc2, Yd1, Yd2) for controlling the electrical connection (conduction/insulation) between the positive-side output terminal TB1 and the negative-side output terminal TB2 of the operational amplifier 34 and the first output terminal NB1 and the second output terminal NB2. The switch Yc1 controls the connection between the positive-side output terminal TB1 and the first output terminal NB1, and the switch Yd1 controls the connection between the negative-side output terminal TB2 and the first output terminal NB1. Further, the switch Yc2 controls the connection between the negative-side output terminal TB2 and the second output terminal NB2, and the switch Yd2 controls the connection between the positive-side output terminal TB1 and the second output terminal NB2. The switch Yc1 and the switch Yc2 operate in response to the control signal $\phi c$, and the switch Yd1 and the switch Yd2 operate in response to the control signal $\phi d$.

Figure 5:
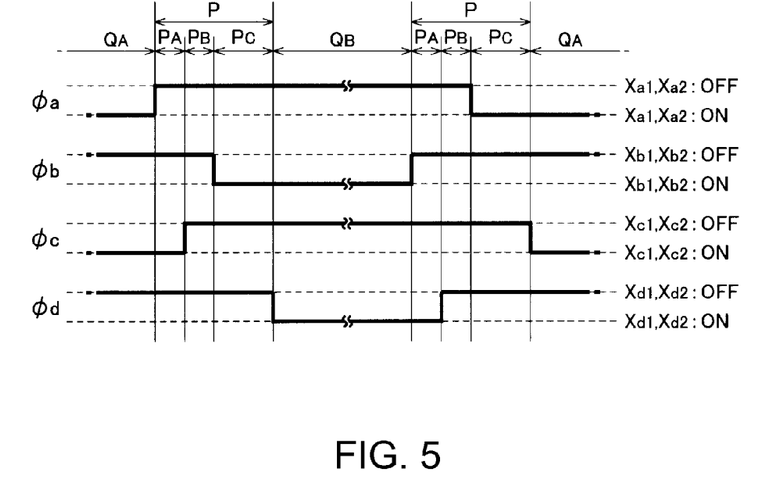
FIG. 5 is a schematic diagram of respective control signals.

FIG. 5 is a schematic diagram of the respective control signals $\phi$ ($\phi a$ to $\phi d$) supplied from the control circuit 16 to the amplifier circuit 18 after a lapse of the initialization period QRST, and FIGS. 6A to 7E are explanatory diagrams of the amplification operation by the amplifier circuit 18. Note that, in the first embodiment, the case where the respective switches (Xa1, Xa2, Xb1, Xb2) of the modulation circuit 32 and the respective switches (Yc1, Yc2, Yd1, Yd2) of the demodulation circuit 36 are formed by P-channel transistors will be exemplified. Therefore, the respective control signals $\phi$ are set at the low level to control the respective switches in the ON-state and the control signals $\phi$ are set at the high level to control the respective switches in the OFF-state. Note that the conductivity types of the transistors used as the respective switches of the modulation circuit 32 and the demodulation circuit 36 are arbitrary. Further, analog switches of combinations of P-channel and N-channel transistors can be used as the respective switches of the modulation circuit 32 and the demodulation circuit 36.

As exemplified in FIG. 5, in the first embodiment, the control circuit 16 generates the respective control signals (chopper clocks) $\phi$ so that a combination of an amplification period QA and an amplification period QB may be sequentially repeated in a cycle corresponding to the frequency fc. The amplification period QA corresponds to one exemplification of a first amplification period and a second amplification period, and the amplification period QB corresponds to the other exemplification of the first amplification period and the second amplification period. The operations in the amplification period QA and the amplification period QB will be described as below in detail.

Amplification Period QA

In the amplification period QA, as exemplified in FIG. 5, the control signal $\phi a$ and the control signal $\phi c$ are set at the low level and the control signal $\phi b$ and the control signal $\phi d$ are set at the high level. Therefore, as exemplified in FIG. 6A, in the modulation circuit 32, the switch Xa1 and the switch Xa2 are controlled in the ON-state and the switch Xb1 and the switch Xb2 are controlled in the OFF-state. Further, in the demodulation circuit 36, the switch Yc1 and the switch Yc2 are controlled in the ON-state and the switch Yd1 and the switch Yd2 are controlled in the OFF-state. That is, in the amplification period QA, the modulation circuit 32 connects the first input terminal NA1 and the negative-side input terminal TA1 and connects the second input terminal NA2 and the positive-side input terminal TA2, and the demodulation circuit 36 connects the positive-side output terminal TB1 and the first output terminal NB1 and connects the negative-side output terminal TB2 and the second output terminal NB2.

Figure 6A:
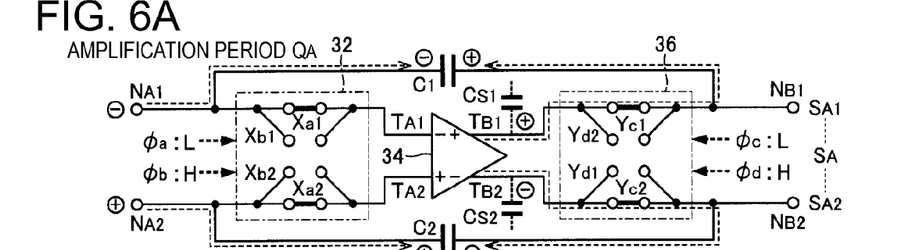
FIGS. 6A to 6E are explanatory diagrams of an amplification operation.
Figure 6B:
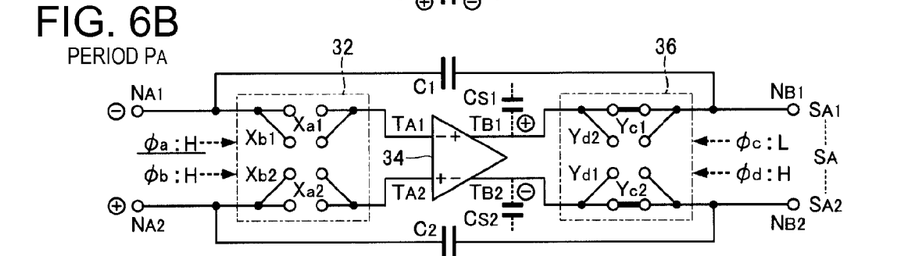
Figure 6C:
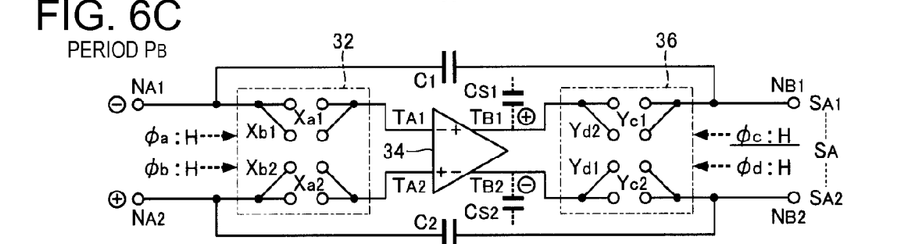
Figure 6D:
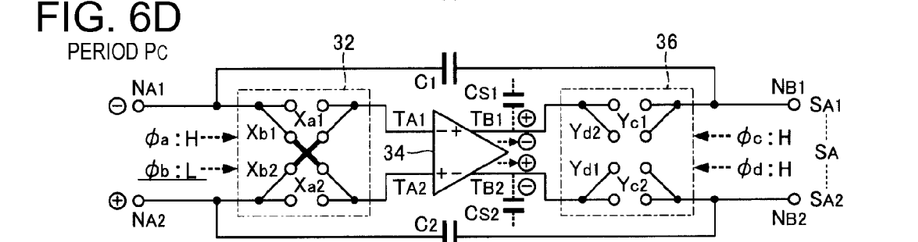

In the above described state (hereinafter, referred to as "first state"), the capacity C1 functions as a feedback capacity between the negative-side input terminal TA1 and the positive-side output terminal TB1 of the operational amplifier 34, and the charge supplied from the first detection terminal D1 of the pyroelectric element 12 to the first input terminal NA1 is charged in the capacity (integral capacity) C1. Therefore, the voltage SA1 of the first output terminal NB1 is set to a voltage in response to the amount of charge and the capacity value of the capacity C1 (the voltage of the capacity C1). That is, in the amplification period QA, the operational amplifier 34 and the capacity C1 function as a charge amplifier (charge-voltage converter circuit) that generates a voltage in response to the charge supplied to the first input terminal NA1. The amplification factor of the voltage SA1 takes a numerical value in response to the capacity ratio between the capacity CD of the pyroelectric element 12 and the capacity C1 of the amplifier circuit 18. Similarly, the charge supplied from the second detection terminal D2 of the pyroelectric element 12 to the second input terminal NA2 is charged in the capacity C2, and the voltage SA2 of the second output terminal NB2 is set to a voltage in response to the amount of charge and the capacity value of the capacity C2. The amplification factor of the voltage SA2 takes a numerical value in response to the capacity ratio between the capacity CD of the pyroelectric element 12 and the capacity C2 of the amplifier circuit 18.

Amplification Period QB

In the amplification period QB, as exemplified in FIG. 5, contrary to the amplification period QA, the control signal $\phi a$ and the control signal $\phi c$ are set at the high level and the control signal $\phi b$ and the control signal $\phi d$ are set at the low level. Therefore, as exemplified in FIG. 6E, in the modulation circuit 32, the switch Xa1 and the switch Xa2 are controlled in the OFF-state and the switch Xb1 and the switch Xb2 are controlled in the ON-state. Further, in the demodulation circuit 36, the switch Yc1 and the switch Yc2 are controlled in the OFF-state and the switch Yd1 and the switch Yd2 are controlled in the ON-state. That is, in the amplification period QB, the modulation circuit 32 connects the first input terminal NA1 and the positive-side input terminal TA2 and connects the second input terminal NA2 and the negative-side input terminal TA1, and the demodulation circuit 36 connects the positive-side output terminal TB1 and the second output terminal NB2 and connects the negative-side output terminal TB2 and the first output terminal NB1.

Figure 6E:
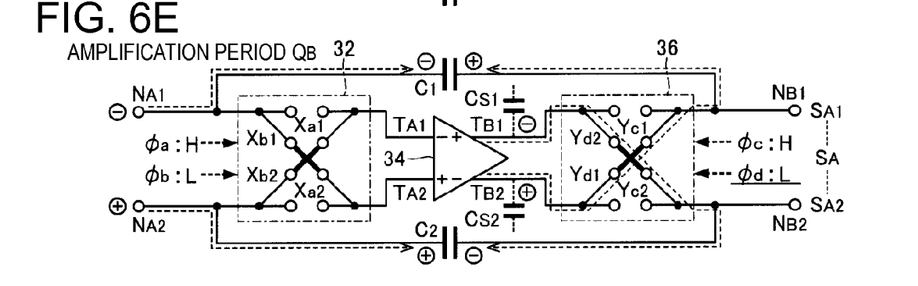

In the above described state (hereinafter, referred to as "second state"), like the amplification period QA, the charge supplied from the first detection terminal D1 of the pyroelectric element 12 to the first input terminal NA1 is charged in the capacity C1 and the voltage SA1 of the first output terminal NB1 is set to a voltage in response to the amount of charge and the capacity value of the capacity C1, and the charge supplied from the second detection terminal D2 to the second input terminal NA2 is charged in the capacity C2 and the voltage SA2 of the second output terminal NB2 is set to a voltage in response to the amount of charge and the capacity value of the capacity C2. As will be understood from the above explanation, by chopping of the frequency fc for cyclically switching between the first state and the second state, the amplified signal SA of the differential (FIG. 2C) represented by the voltage SA1 and the SA2 is generated.

In a configuration in which the initialization switch 14 in FIG. 1 is omitted and the second detection terminal D2 of the pyroelectric element 12 is fixedly connected to the power source 22 (hereinafter, referred to as "comparative example 1"), a state in which the switch Xa2 transitions to the ON-state and the initialized voltage VRST is supplied from the power source 22 to the positive-side input terminal TA2 of the operational amplifier 34 and a state in which the switch Xa2 transitions to the OFF-state and the positive-side input terminal TA2 is maintained in the electrically floating state are alternately repeated. Therefore, in the comparative example 1, there is a problem of lower stability of the amplification operation. On the other hand, in the first embodiment, the initialization switch 14 is maintained in the OFF-state during execution of the amplification operation, and the first detection terminal D1 and the second detection terminal D2 of the pyroelectric element 12 are maintained in the electrically floating state. Therefore, not only in the state in which the operational amplifier 34 is insulated from the first input terminal NA1 and the second input terminal NA2 but also in the state in which the operational amplifier 34 is connected to the first input terminal NA1 and the second input terminal NA2, the negative-side input terminal TA1 and the positive-side input terminal TA2 of the operational amplifier 34 are maintained in the electrically floating state. Therefore, according to the first embodiment, the amplification operation can be stabilized compared to the comparison example 1.

Preparation Period P

As exemplified in FIG. 5, a preparation period P for appropriate transition one of the first state and the second state to the other between the amplification period QA and the amplification period QB is secured. The preparation period P of the first embodiment contains a period PA, a period PB, and a period PC. The period PA and the period PB are periods between the amplification period QA or the amplification period QB and the period PC. Specifically, the period PA is a period immediately before the period PB and the period PC is a period immediately after the period PB. Note that the preparation periods P exist both immediately after the amplification period QA and immediately after the amplification period QB, and, for convenience, attention is focused on the preparation period P immediately after the amplification period QA in the following explanation.

Of the preparation period P, in the period PA immediately after the amplification period QA, as exemplified in FIG. 5, the control signal φa is changed to the high level while the control signal φb, the control signal φc, and the control signal φd are maintained at the same levels as those in the amplification period QA. Therefore, as exemplified in FIG. 6B, from the first state of the amplification period QA, the switch Xa1 and the switch Xa2 of the modulation circuit 32 transition to the OFF state. That is, the modulation circuit 32 insulates the first input terminal NA1 and the second input terminal NA2 from the operational amplifier 34 while the demodulation circuit 36 maintains the same connection between the first output terminal NB1 and the second output terminal NB2 and the operational amplifier 34 as that in the amplification period QA.

In the period PB immediately after the period PA, as exemplified in FIG. 5, the control signal φc is changed to the high level while the control signal φa, the control signal φb, and the control signal φd are maintained at the same levels as those in the period PA. Therefore, as exemplified in FIG. 6C, from the state of the period PA, the switch Yc1 and the switch Yc2 of the demodulation circuit 36 transition to the OFF-state. That is, the demodulation circuit 36 insulates the first output terminal NB1 and the second output terminal NB2 from the operational amplifier 34 while the modulation circuit 32 insulates the first input terminal NA1 and the second input terminal NA2 from the operational amplifier 34. As exemplified above, in the period PB (release period) of the preparation period P, the first input terminal NA1, the second input terminal NA2, the first output terminal NB1, and the second output terminal NB2 are insulated from the operational amplifier 34.

In a configuration in which the preparation periods P are omitted and the amplification period QA and the amplification period QB are alternately continued (hereinafter, referred to as "comparative example 2"), it may be possible that the period in which the control signal φa is set at the low level in the amplification period QA and the period in which the control signal φb is set at the low level in the amplification period QB overlap each other. When both the control signal φa and the control signal φb are set at the low level, all of the switches (Xa1, Xa2, Xb1, Xb2) of the modulation circuit 32 are controlled simultaneously in the ON-state (the first input terminal NA1 and the second input terminal NA2 conduct to each other), and thereby, the negative charge existing in the first input terminal NA1 and the capacity C1 and the positive charge existing in the second input terminal NA2 and the capacity C2 are cancelled out. Therefore, in the comparative example 2, it may be impossible to sufficiently charge the capacity C1 and the capacity C2 and, as a result, the appropriate amplification operation by the amplifier circuit 18 may be hindered. The attention is focused on the conduction between the first input terminal NA1 and the second input terminal NA2 in the above explanation, and similarly, the charge may be cancelled out in the case where both the control signal φc and the control signal φd are set to the low level and all of the switches (Yc1, Yc2, Yd1, Yd2) of the demodulation circuit 36 are controlled simultaneously in the ON-state.

Compared to the above described comparative example 2, in the first embodiment, the period PA in which the first input terminal NA1 and the second input terminal NA2 are insulated from the operational amplifier 34 and the period PB in which the first output terminal NB1 and the second output terminal NB2 are insulated from the operational amplifier 34 are secured between the amplification period QA and the amplification period QB, and thereby, the situation in which both the control signal φa and the control signal φb are set at the low level and the situation in which both the control signal φc and the control signal φd are set at the low level are avoided. Therefore, cancelling out of charge due to conduction between the first input terminal NA1 and the second input terminal NA2 and conduction between the first output terminal NB1 and the second output terminal NB2 is prevented. That is, according to the first embodiment, compared to the comparative example 2, the charge generated in the pyroelectric element 12 can be reliably charged in the capacity C1 and the capacity C2 and the appropriate amplification operation by the amplifier circuit 18 may be realized.

Now, capacities (parasitic capacities) are incidental on the positive-side output terminal TB1 and the negative-side output terminal TB2 of the operational amplifier 34. As exemplified in the FIG. 6A, in the amplification period QA, positive charge is charged in a capacity CS1 incidental on the positive-side output terminal TB1 and negative charge is charged in a capacity CS2 incidental on the negative-side output terminal TB2. The charge of the capacity CS1 and the capacity CS2 is maintained even in the period PA and the period PB. Therefore, in a configuration in which the period PC is omitted and the amplification period QB is started immediately after the period PB (hereinafter referred to as "comparative example 3"), when the switch Yd1 of the demodulation circuit 36 transitions to the ON-state at the start of the amplification period QB, the positive charge accumulated in the capacity C1 in the amplification period QA immediately before and the negative charge accumulated in the capacity CS2 incidental on the negative-side output terminal TB2 are cancelled out. Similarly, when the switch Yd2 of the demodulation circuit 36 transitions to the ON-state at the start of the amplification period QB, the negative charge accumulated in the capacity C2 in the amplification period QA and the positive charge accumulated in the capacity CS1 incidental on the positive-side output terminal TB1 are cancelled out. In the comparative example 3, the voltages of the capacity C1 and the capacity C2 are lower due to the above described cancelling out of the charge and, as a result, the appropriate amplification operation by the amplifier circuit 18 may be hindered.

To solve the above described problem of the comparative example 3, in the first embodiment, the period PC (transition period) in FIG. 5 is secured immediately before the amplification period QB. Specifically, in the period PC, the control signal φb is changed to the low level while the control signal φa, the control signal φc, and the control signal φd are maintained at the same high level as that in the period PB immediately before. Therefore, from the state of the period PB in which the first input terminal NA1, the second input terminal NA2, the first output terminal NB1, and the second output terminal NB2 are insulated from the operational amplifier 34, as exemplified in FIG. 6D, the switch Xb1 and the switch Xb2 of the modulation circuit 32 transition to the ON-state. That is, in the state in which the demodulation circuit 36 insulates the first output terminal NB1 and the second output terminal NB2 from the operational amplifier 34, the modulation circuit 32 connects the first input terminal NA1 and the positive-side input terminal TA2 and connects the second input terminal NA2 and the negative-side input terminal TA1. Under the above described condition, negative charge is supplied from the positive-side output terminal TB1 to the capacity CS1 in the state in which the positive-side output terminal TB1 of the operational amplifier 34 and the capacity C1 are insulated, and positive charge is changed from the negative-side output terminal TB2 to the capacity CS2 in the state in which the negative-side output terminal TB2 of the operational amplifier 34 and the capacity C2 are insulated. That is, the positive charge of the capacity CS1 and the negative charge of the capacity CS2 accumulated before the start of the period PC are diminished. In the above described amplification period QB after the end of the period PC, as exemplified in FIG. 6E, the capacity C1 is connected to the negative-side output terminal TB2 and the capacity C2 is connected to the positive-side output terminal TB1. Therefore, in the first embodiment, there is an advantage that reduction of the voltages of the capacity C1 and the capacity C2 due to the cancelling out of the charge immediately after the start of the amplification period QB may be suppressed and the appropriate amplification operation by the amplifier circuit 18 may be realized.

Note that, in the above explanation, the attention is focused on the preparation period P immediately after the amplification period QA and, as exemplified as below, the similar operation is executed in the preparation period P immediately after the amplification period QB. In the amplification period QB exemplified in FIG. 7A, as described above, the first input terminal NA1 and the positive-side input terminal TA2 are connected and the second input terminal NA2 and the negative-side input terminal TA1 are connected, and the positive-side output terminal TB1 and the second output terminal NB2 are connected and the negative-side output terminal TB2 and the first output terminal NB1 are connected. Therefore, negative charge is charged in the capacity CS1 incidental on the positive-side output terminal TB1 of the operational amplifier 34 and positive charge is charged in the capacity CS2 incidental on the negative-side output terminal TB2.

Figure 7A:
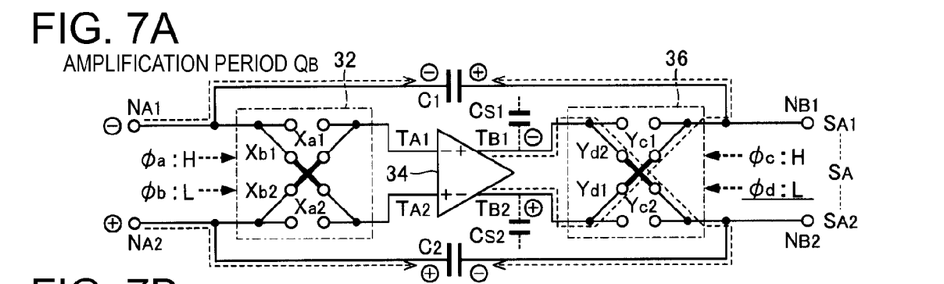
FIGS. 7A to 7E are explanatory diagrams of an amplification operation.
Figure 7B:
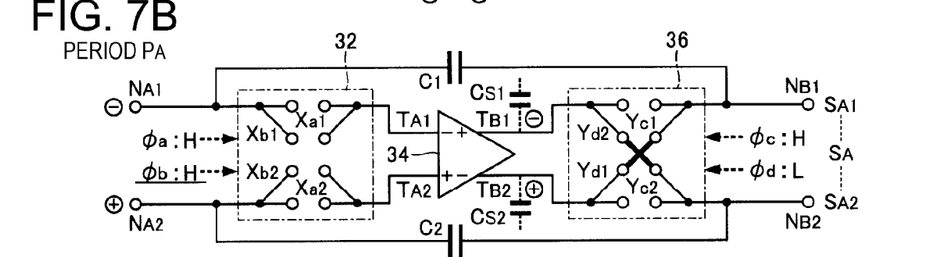
Figure 7C:
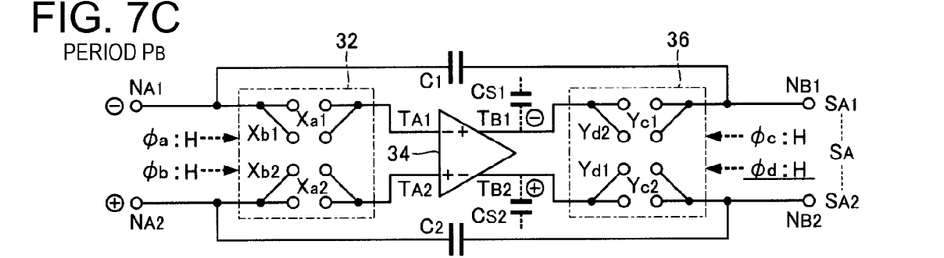
Figure 7D:
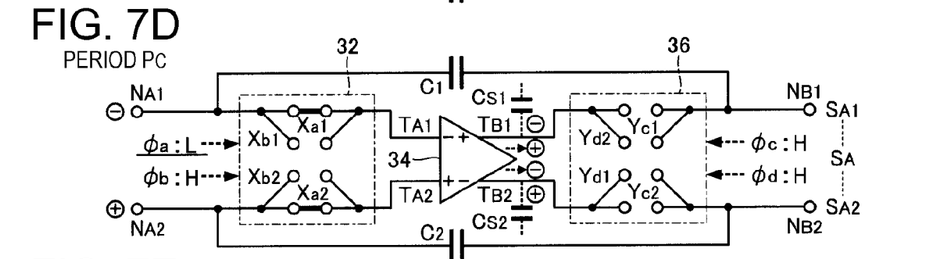
Figure 7E:
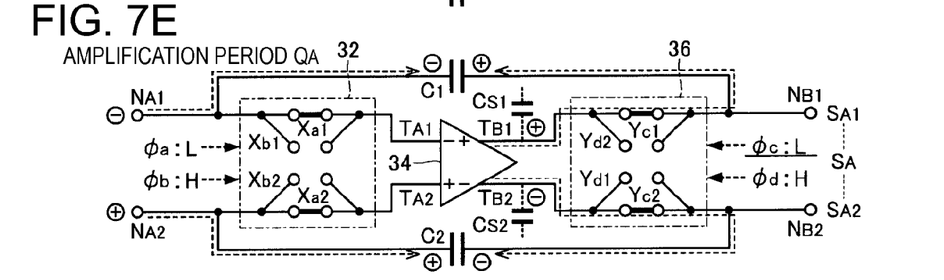

In the period PA of the preparation period P immediately after the amplification period QB, as exemplified in FIG. 7B, the control signal φb is changed to the high level and the first input terminal NA1 and the second input terminal NA2 are insulated from the operational amplifier 34, and, in the period PB immediately after, as exemplified in FIG. 7C, the control signal φd is changed to the high level and the first output terminal NB1 and the second output terminal NB2 are insulated from the operational amplifier 34. Then, in the period PC of the preparation period P immediately after the amplification period QB, the control signal φa is changed to the low level, and, as exemplified in FIG. 7D, the first input terminal NA1 is connected to the negative-side input terminal TA1 of the operational amplifier 34 and the second input terminal NA2 is connected to the positive-side input terminal TA2. Under the above described condition, positive charge is supplied from the positive-side output terminal TB1 to the capacity CS1 in the state in which the positive-side output terminal TB1 of the operational amplifier 34 and the capacity C1 are insulated, and negative charge is supplied from the negative-side output terminal TB2 to the capacity CS2 in the state in which the negative-side output terminal TB2 of the operational amplifier 34 and the capacity C2 are insulated. That is, the negative charge of the capacity CS1 and the positive charge of the capacity CS2 accumulated before the start of the period PC are diminished in the period PC. In the above described amplification period QA after the end of the period PC, the capacity C1 is connected to the positive-side output terminal TB1 and the capacity C2 is connected to the negative-side output terminal TB2. Therefore, there is an advantage that reduction of the voltages of the capacity C1 and the capacity C2 due to the cancelling out of the charge immediately after the start of the amplification period QA may be suppressed and the appropriate amplification operation by the amplifier circuit 18 may be realized.

The period PC is set to have a time length to the degree at which the charge accumulated in the capacity CS1 and the capacity CS2 before the start of the period PC is diminished. Specifically, the period PC is set to have a time length in response to the time constant depending on the output impedance of the operational amplifier 34 and the capacity value of the capacity CS1 or capacity CS2. The period PC of the first embodiment is set to be longer than that of the period PA and the period PB.

Second Embodiment

A second embodiment of the invention will be explained. In each embodiment exemplified as below, the signs used in the explanation of the first embodiment will be employed for the elements having the same operations and functions as those of the first embodiment, and their respective detailed explanation will be appropriately omitted.

Figure 8:
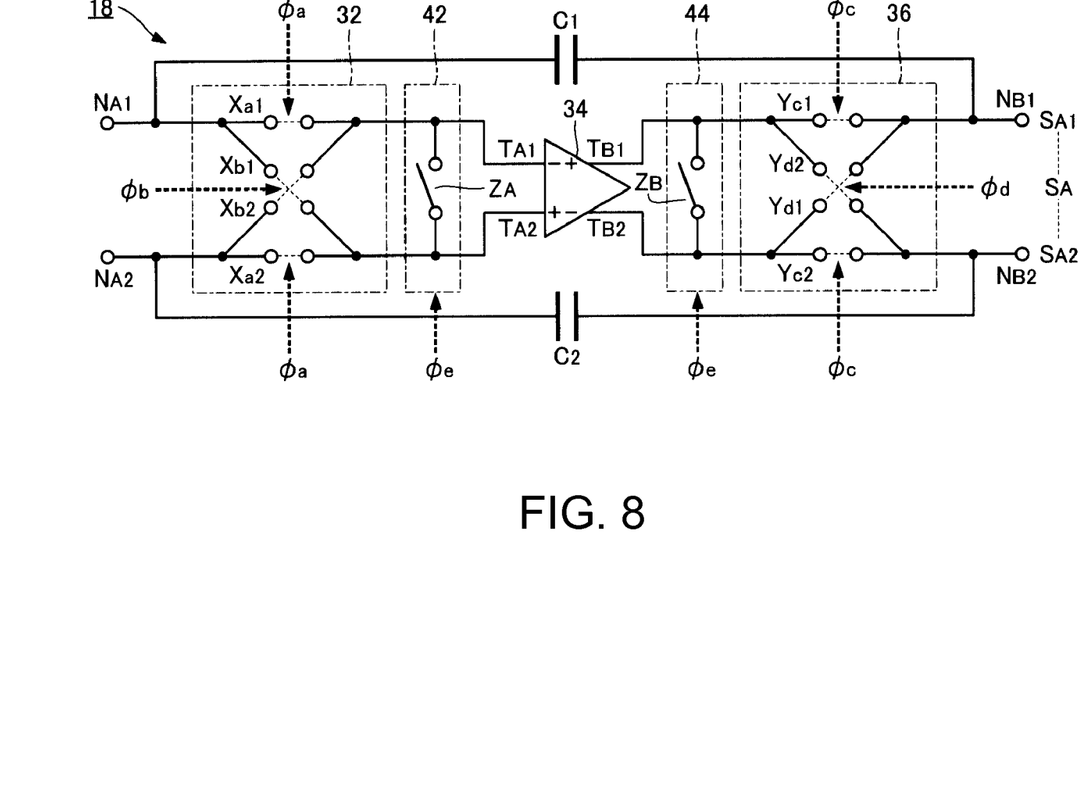
FIG. 8 is a configuration diagram of an amplifier circuit in the second embodiment.

FIG. 8 is a configuration diagram of an amplifier circuit 18 of a detecting device 100 in the second embodiment of the invention. As exemplified in FIG. 8, the amplifier circuit 18 of the second embodiment has a configuration in which a first circuit 42 and a second circuit 44 are added to the same elements (modulation circuit 32, operational amplifier 34, demodulation circuit 36, capacity C1, capacity C2) as those of the amplifier circuit 18 of the first embodiment. The first circuit 42 is provided between the negative-side input terminal TA1 and the positive-side input terminal TA2 of the operational amplifier 34, and the second circuit 44 is provided between the positive-side output terminal TB1 and the negative-side output terminal TB2 of the operational amplifier 34. The first circuit 42 includes a switch ZA that intervenes between the negative-side input terminal TA1 and the positive-side input terminal TA2 and controls electrical connection (conduction/insulation) between the terminals. Similarly, the second circuit 44 includes a switch ZB that intervenes between the positive-side output terminal TB1 and the negative-side output terminal TB2 and controls electrical connection between the terminals. Further, a control circuit 16 of the second embodiment generates a control signal φe for controlling the first circuit 42 and the second circuit 44. Note that, in the following explanation, the case where the switch ZA and the switch ZB are formed by P-channel transistors will be exemplified for convenience, however, the conductivity types of the transistors forming the switch ZA and the switch ZB are arbitrary.

Figure 9:
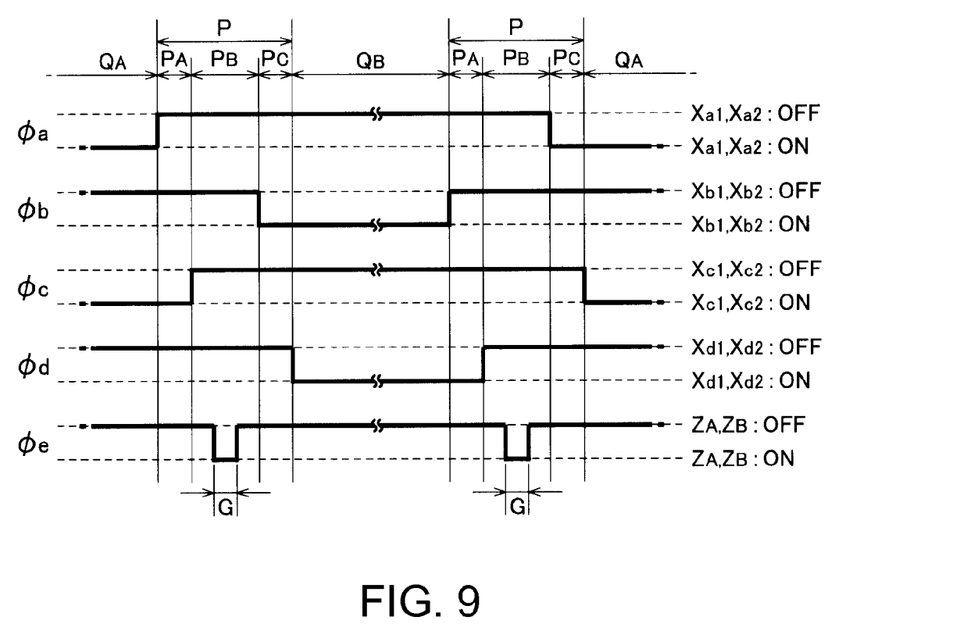
FIG. 9 is a schematic diagram of respective control signals in the second embodiment.

FIG. 9 is a schematic diagram of respective control signals φ (φa to φe) supplied to the amplifier circuit 18 by the control circuit 16 of the second embodiment. The operations in the amplification period QA and the amplification period QB and the operations of the period PA and the period PC of the preparation period P are the same as those in the first embodiment. Therefore, the same advantages as those of the first embodiment are realized in the second embodiment.

As exemplified in FIG. 9, the control signal φe is set at the low level within the period PB of the preparation period P in which the first input terminal NA1, the second input terminal NA2, the first output terminal NB1, and the second output terminal NB2 are insulated from the operational amplifier 34. Specifically, the control signal φe is set at the low level in a partial period G of the period PB and maintained at the high level in the other periods than the period G. The start point of the period G is located posterior to the start point of the period PB and the end point of the period G is located anterior to the end point of the period PB.

When the control signal φe is set at the low level in the period G, the switch ZA of the first circuit 42 and the switch ZB of the second circuit 44 transition to the ON-state. Therefore, the negative-side input terminal TA1 and the positive-side input terminal TA2 of the operational amplifier 34 are electrically connected via the switch ZA of the first circuit 42, and the positive-side output terminal TB1 and the negative-side output terminal TB2 are electrically connected via the switch ZB of the second circuit 44. Therefore, in the period G, the residual charge in each of the negative-side input terminal TA1 and the positive-side input terminal TA2 is cancelled out and the residual charge in each of the positive-side output terminal TB1 and the negative-side output terminal TB2 is cancelled out. That is, the potential difference between the input terminals and the potential difference between the output terminals of the operational amplifier 34 are reduced (ideally, eliminated).

In the amplification period QA exemplified in FIG. 6A, negative charge may remain in the negative-side input terminal TA1 of the operational amplifier 34 and positive charge may remain in the positive-side input terminal TA2. Therefore, in a configuration without the period G, at the start point of the period PC (FIG. 6D), when the first input terminal NA1 is connected to the positive-side input terminal TA2 and the second input terminal NA2 is connected to the negative-side input terminal TA1, the negative charge supplied to the first input terminal NA1 and the positive charge remaining in the positive-side input terminal TA2 may be cancelled out and the positive charge supplied to the second input terminal NA2 and the negative charge remaining in the negative-side input terminal TA1 may be cancelled out. The same problem may occur with respect to the residual charge on the input side of the operational amplifier 34 in the amplification period QB. In the second embodiment, the negative-side input terminal TA1 and the positive-side input terminal TA2 of the operational amplifier 34 are electrically connected and the respective residual charge is cancelled out in the period G within the period PB, and thereby, diminishing of the charge supplied to the first input terminal NA1 and the second input terminal NA2 is suppressed in the period PC. Therefore, the appropriate amplification operation by the amplifier circuit 18 may be realized.

The same applies to the positive-side output terminal TB1 and the negative-side output terminal TB2 of the operational amplifier 34, and the charge remaining in the positive-side output terminal TB1 (capacity CS1) of the operational amplifier 34 and the charge remaining in the negative-side output terminal TB2 (capacity CS2) in the amplification period QA are cancelled out in the period G, and thereby, the appropriate amplification operation by the amplifier circuit 18 may be realized. Note that, as described above, the charge of the positive-side output terminal TB1 and the charge of the negative-side output terminal TB2 are cancelled out in the period G, and thereby, the time length necessary for the period PC may be made shorter than that in the first embodiment. For example, the period PC is set to have an equal time length to that of the period PA.

Further, in the second embodiment, initialization to the state in which the potential difference between the input terminals and the potential difference between the output terminals of the operational amplifier 34 are reduced is performed before the start of each of the amplification period QA and the amplification period QB, and thereby, there is another advantage that the operational amplifier 34 can be stably operated without the influence of the state before the start of the amplification operation.

Third Embodiment

Figure 10:
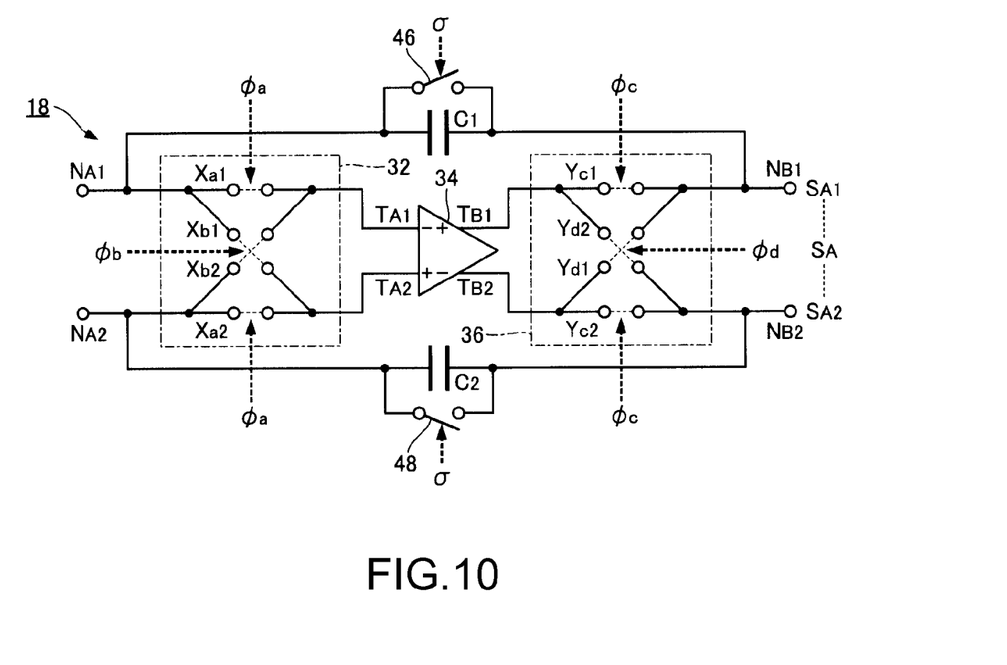
FIG. 10 is a configuration diagram of an amplifier circuit in the third embodiment.

FIG. 10 is a configuration diagram of an amplifier circuit 18 of a detecting device 100 in the third embodiment. As exemplified in FIG. 10, the amplifier circuit 18 of the third embodiment has a configuration in which a switch 46 and a switch 48 are added to the same elements (modulation circuit 32, operational amplifier 34, demodulation circuit 36, capacity C1, capacity C2) as those of the amplifier circuit 18 of the first embodiment. The switch 46 is provided between the electrodes of a capacity C1 (between the first input terminal NA1 and the first output terminal NB1), and the switch 48 is provided between the electrodes of a capacity C2 (between the second input terminal NA2 and the second output terminal NB2).

A control circuit 16 of the third embodiment controls the switch 46 and the switch 48 by supplying the control signal σ for controlling the initialization switch 14. That is, the switch 46 and the switch 48 of the third embodiment transition to the ON-state with an initialization switch 14 in an initialization period QRST before the start of an amplification operation, and maintained in the OFF state during execution of the amplification operation. Therefore, in the initialization period QRST before the start of the amplification operation, the voltages of the capacity C1 and the capacity C2 are initialized to zero.

Also, in the third embodiment, the same advantages as those of the first embodiment are realized. Further, in the third embodiment, the voltages of the capacity C1 and the capacity C2 are initialized before the start of the amplification operation, and thereby, there is an advantage that the influence of the remaining charge in the capacity C1 and the capacity C2 at the start of the amplification operation maybe reduced and the appropriate amplification operation may be executed. Furthermore, in the third embodiment, the common control signal σ is employed for the control of the initialization switch 14 and the control of the switch 46 and the switch 48, and thereby, there is an advantage that the configuration and the operation of the control circuit 16 are simplified compared to the configuration using separate signals from each other. Obviously, the initialization switch 14, the switch 46, and the switch 48 can be individually controlled. Note that the first circuit 42 and the second circuit 44 of the second embodiment can be employed in the third embodiment.

Modified Examples

The above exemplified respective embodiments may be variously modified. The specific modified embodiments will be exemplified as below. The two or more embodiments arbitrarily selected from the following exemplification may be appropriately combined in a range consistent with each other.

Figures 11, 12:
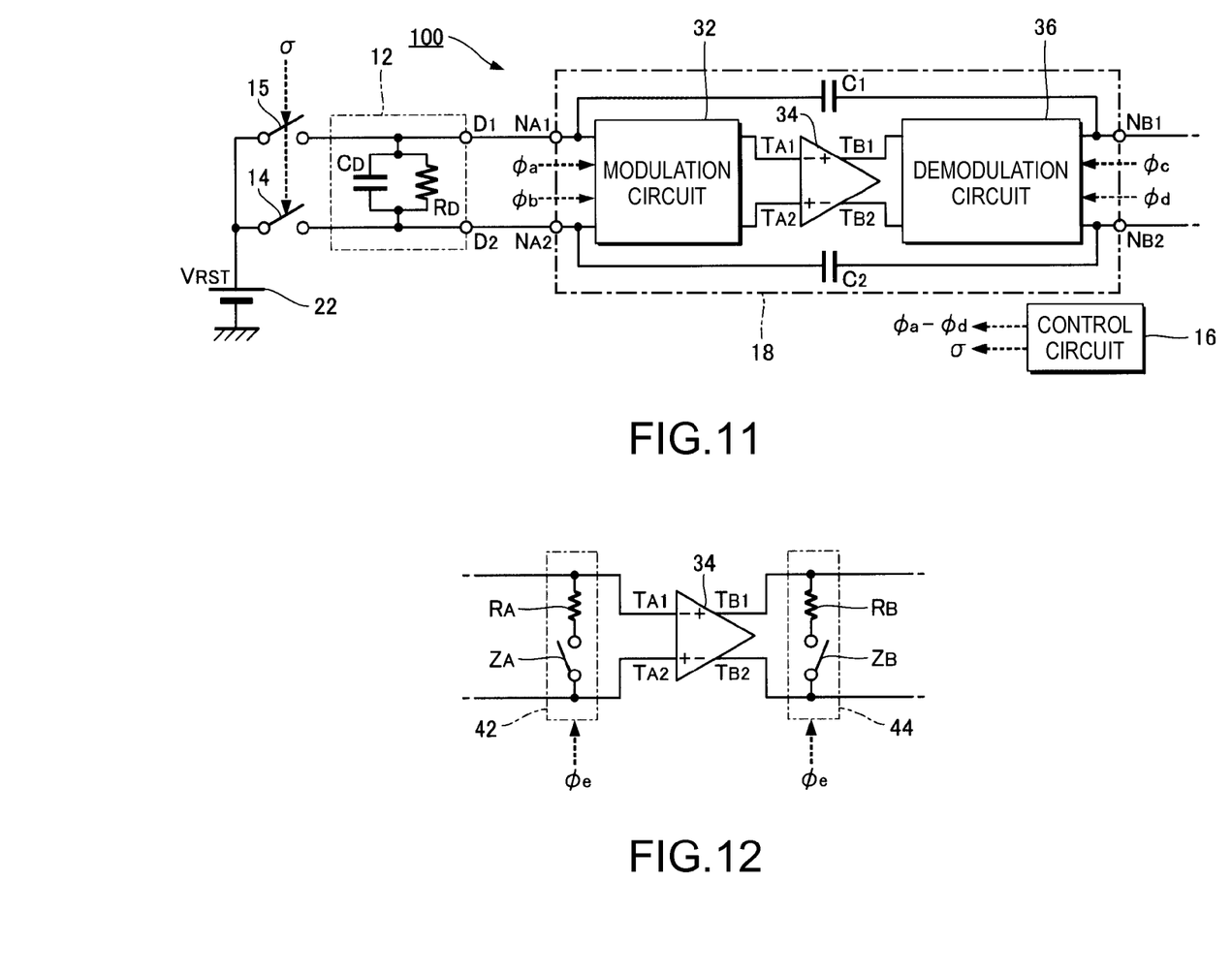
FIG. 11 is a configuration diagram of a detecting device in a modified example.
FIG. 12 is a configuration diagram of a first circuit and a second circuit according to the modified example.

(1) In the first embodiment, the configuration in which the second detection terminal D2 of the pyroelectric element 12 is connected to the power source 22 in the initialization period QRST is exemplified. A virtual short circuit holds between the negative-side input terminal TA1 and the positive-side input terminal TA2 of the operational amplifier 34. For example, the switch Xa1 and the switch Xa2 of the modulation circuit 32 are maintained in the ON-state in the initialization period QRST, and thereby, the first detection terminal D1 of the pyroelectric element 12 is initialized to a voltage equivalent to that (initialized voltage VRST) of the second detection terminal D2. Note that, in view of reliable initialization both the first detection terminal D1 and the second detection terminal D2 of the pyroelectric element 12 to a predetermined voltage, as exemplified in FIG. 11, it is preferable to provide another initialization switch 15 between the first detection terminal D1 and the power source 22 in addition to the initialization switch 14 provided between the second detection terminal D2 and the power source 22. The initialization switch 14 and the initialization switch 15 operate in response to the common control signal σ supplied from the control circuit 16. Specifically, the initialization switch 14 and the initialization switch 15 are controlled in the ON-state in the initialization period QRST and maintained in the OFF-state during the execution of the amplification operation. As will be understood from the above explanation, it is preferable to provide a switch (e.g. initialization switch 14 or the initialization switch 15) for controlling electrical connection between at least one of the first detection terminal D1 and the second detection terminal D2 of the pyroelectric element 12 and the power source 22.

(2) The specific amplification operation by the amplifier circuit 18 may be appropriately changed. For example, a configuration without the period PA of the preparation period P (a configuration in which the period PB is started immediately after the amplification period QA or the amplification period QB) may be employed. Further, in the second embodiment, the period PC of the preparation period P may be omitted (the amplification period QA or the amplification period QB may be started immediately after the period PB).

(3) The configurations of the first circuit 42 and the second circuit 44 in the second embodiment are not limited to the exemplification (switch ZA, switch ZB) in FIG. 10. For example, as exemplified in FIG. 12, a configuration in which the first circuit 42 includes the switch ZA and a resistance RA series-connected between the negative-side input terminal TA1 and the positive-side input terminal TA2 of the operational amplifier 34 and a configuration in which the second circuit 44 includes the switch ZB and a resistance RB series-connected between the positive-side output terminal TB1 and the negative-side output terminal TB2 may be employed. As will be understood from the above explanation, the first circuit 42 is comprehensively represented as means for reducing the potential difference between the negative-side input terminal TA1 and the positive-side input terminal TA2 of the operational amplifier 34, and a configuration of setting the negative-side input terminal TA1 and the positive-side input terminal TA2 at the same potential is not essential. Similarly, the second circuit 44 is comprehensively represented as means for reducing the potential difference between the positive-side output terminal TB1 and the negative-side output terminal TB2, and a configuration of setting the positive-side output terminal TB1 and the negative-side output terminal TB2 of the operational amplifier 34 at the same potential is not essential. Note that one of the first circuit 42 and the second circuit 44 may be omitted.

Electronic Apparatuses

The detecting devices 100 according to the above described respective embodiments are used for various electronic apparatuses. For example, the detecting devices 100 of the above described respective embodiments may be used for a human sensor for sensing the existence of a human using infrared light. In arbitrary electronic apparatuses including display apparatuses (television, monitor, electronic paper, car navigation system), imaging apparatuses (video camera, still camera), information terminals (cell phone, smartphone, game machine), for example, in order to determine existence or absence of a user, the detecting devices 100 of the above described respective embodiments may be used.

The entire disclosure of Japanese Patent Application No. 2014-179748 filed Sep. 4, 2014 is expressly incorporated by reference herein.

What is claimed is:

1. A detecting device comprising:
   a pyroelectric element that generates a voltage between a first detection terminal and a second detection terminal by a pyroelectric effect; and
   a chopper amplifier circuit that generates an amplified signal in response to the voltage by chopping, wherein the chopper amplifier circuit outputs to a first output terminal and a second output terminal an amplified signal in response to the voltage generated between a first input terminal connected to the first detection terminal and a second input terminal connected to the second detection terminal, and the chopper amplifier circuit includes:
      a fully differential operational amplifier including a first amplification input terminal, a second amplification input terminal, a first amplification output terminal, and a second amplification output terminal;
      a first capacity between the first input terminal and the first output terminal;
      a second capacity between the second input terminal and the second output terminal;
      a modulation circuit that switches electrical connection between the first input terminal and the second input terminal and the first amplification input terminal and the second amplification input terminal; and
      a demodulation circuit that switches electrical connection between the first amplification output terminal and the second amplification output terminal and the first output terminal and the second output terminal.

2. The detecting device according to claim 1, further comprising an initialization switch that controls electrical connection between at least one of the first detection terminal and the second detection terminal and a power source for generating an initialized voltage,
   wherein the initialization switch is turned on before a start of an amplification operation by the amplifier circuit and is off during the amplification operation.

3. An electronic apparatus comprising the detecting device according to claim 2.

4. The detecting device according to claim 1, wherein the amplifier circuit includes:
   a first switch provided between ends of the first capacity; and
   a second switch provided between ends of the second capacity,
   wherein the first switch and the second switch are turned on before a start of an amplification operation by the amplifier circuit and is off during the amplification operation.

5. An electronic apparatus comprising the detecting device according to claim 4.

6. An electronic apparatus comprising the detecting device according to claim 1.

* * * * *